US008497179B2

(12) United States Patent
Sultan

(10) Patent No.: US 8,497,179 B2
(45) Date of Patent: Jul. 30, 2013

(54) METHOD OF FABRICATING MULTI-FINGERED SEMICONDUCTOR DEVICES ON A COMMON SUBSTRATE

(75) Inventor: Akif Sultan, Austin, TX (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 738 days.

(21) Appl. No.: 12/684,697

(22) Filed: Jan. 8, 2010

(65) Prior Publication Data

US 2011/0171801 A1 Jul. 14, 2011

(51) Int. Cl.
*H01L 21/336* (2006.01)

(52) U.S. Cl.
USPC ............. 438/300; 257/E21.619; 257/E21.634

(58) Field of Classification Search
USPC ............. 438/300–307; 257/E21.45, E21.619, 257/E21.634
See application file for complete search history.

(56) References Cited

U.S. PATENT DOCUMENTS

| | | | | |
|---|---|---|---|---|
| 2008/0054250 | A1 * | 3/2008 | Chuang et al. | 257/19 |
| 2009/0061645 | A1 * | 3/2009 | Richter et al. | 438/763 |
| 2009/0236633 | A1 * | 9/2009 | Chuang et al. | 257/190 |
| 2009/0258463 | A1 * | 10/2009 | Kim et al. | 438/142 |

* cited by examiner

*Primary Examiner* — Brook Kebede
(74) *Attorney, Agent, or Firm* — Ingrassia Fisher & Lorenz, P.C.

(57) ABSTRACT

A method of fabricating p-type metal oxide semiconductor (PMOS) transistor devices on a common substrate is presented. The method provides a first portion of semiconductor material and a second portion of semiconductor material on the common substrate. The first portion of semiconductor material and the second portion of semiconductor material are insulated from each other. The method continues by creating first PMOS transistor devices using the first portion of semiconductor material. The first PMOS transistor devices include stressor regions that impart compressive stress to channel regions of the first PMOS transistor devices. The method also creates second PMOS transistor devices using the second portion of semiconductor material. The second PMOS transistor devices do not include channel stressor regions.

7 Claims, 7 Drawing Sheets

METHOD OF FABRICATING MULTI-FINGERED SEMICONDUCTOR DEVICES ON A COMMON SUBSTRATE

TECHNICAL FIELD

Embodiments of the subject matter described herein relate generally to semiconductor devices. More particularly, embodiments of the subject matter relate to fabrication of semiconductor transistors having embedded stress elements.

BACKGROUND

The prior art is replete with different techniques and processes for fabricating semiconductor devices such as metal oxide semiconductor (MOS) transistors. In accordance with typical fabrication techniques, a MOS transistor is formed by creating a device structure on a semiconductor substrate, where the device structure includes a gate stack formed on a layer of semiconductor material, and source and drain regions that define a channel region under the gate stack. In addition, embedded stress or strain elements (i.e., doped/undoped semiconductor material that stresses the channel region) can be used to improve the performance of MOS transistors. These stress elements or stressor regions are typically formed by creating recesses in the semiconductor material on both sides of the channel region. Thereafter, the recesses are filled with a different type of semiconductor material that imparts compressive or tensile stress on the channel region. For n-type MOS transistors, tensile stressor regions improve the mobility of electrons in the channel region. Conversely, for p-type MOS transistors, compressive stressor regions improve the mobility of holes in the channel region.

BRIEF SUMMARY OF EMBODIMENTS

A method of fabricating semiconductor devices on a common substrate is provided here. The common substrate has a first portion of semiconductor material and a second portion of semiconductor material, which are insulated from each other. The method forms at least N gate structures overlying the first portion of semiconductor material, where N is an integer greater than one. Each of the at least N gate structures is formed overlying a respective channel region in the first portion of semiconductor material. The method also forms less than N gate structures overlying the second region of semiconductor material, wherein each of the less than N gate structures is formed overlying a respective channel region in the second portion of semiconductor material. The method continues by creating recesses in the first portion of semiconductor material such that at least a portion of each channel region in the first portion of semiconductor material resides between two adjacent recesses. Recesses are not formed in the second portion of semiconductor material. Thereafter, the method at least partially fills the recesses in the first portion of semiconductor material with stress-inducing semiconductor material.

Also provided is a method of fabricating p-type metal oxide semiconductor (PMOS) transistor devices on a common substrate. The method begins by providing a first portion of semiconductor material and a second portion of semiconductor material on the common substrate, the first portion of semiconductor material and the second portion of semiconductor material being insulated from each other. The method continues by creating first PMOS transistor devices using the first portion of semiconductor material and by creating second PMOS transistor devices using the second portion of semiconductor material. The first PMOS transistor devices have stressor regions that impart compressive stress to channel regions of the first PMOS transistor devices, while the second PMOS transistor devices are free of channel stressor regions.

Another method of fabricating PMOS transistor devices on a common substrate is provided. The method obtains a layout of PMOS transistor devices that designates a plurality of device structures. Each of the plurality of device structures includes a respective region of active semiconductor material and at least one gate finger associated therewith. The method also obtains a minimum gate count for application of stressor regions, and identifies, from the plurality of device structures, a first set of device structures and a second set of device structures. Each device structure in the first set of device structures has a number of gate fingers that is greater than or equal to the minimum gate count, and each device structure in the second set of device structures has a number of gate fingers that is less than the minimum gate count. The method continues by fabricating the first set of device structures on the common substrate using compressive stressor regions, and fabricating the second set of device structures on the common substrate without using compressive stressor regions.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
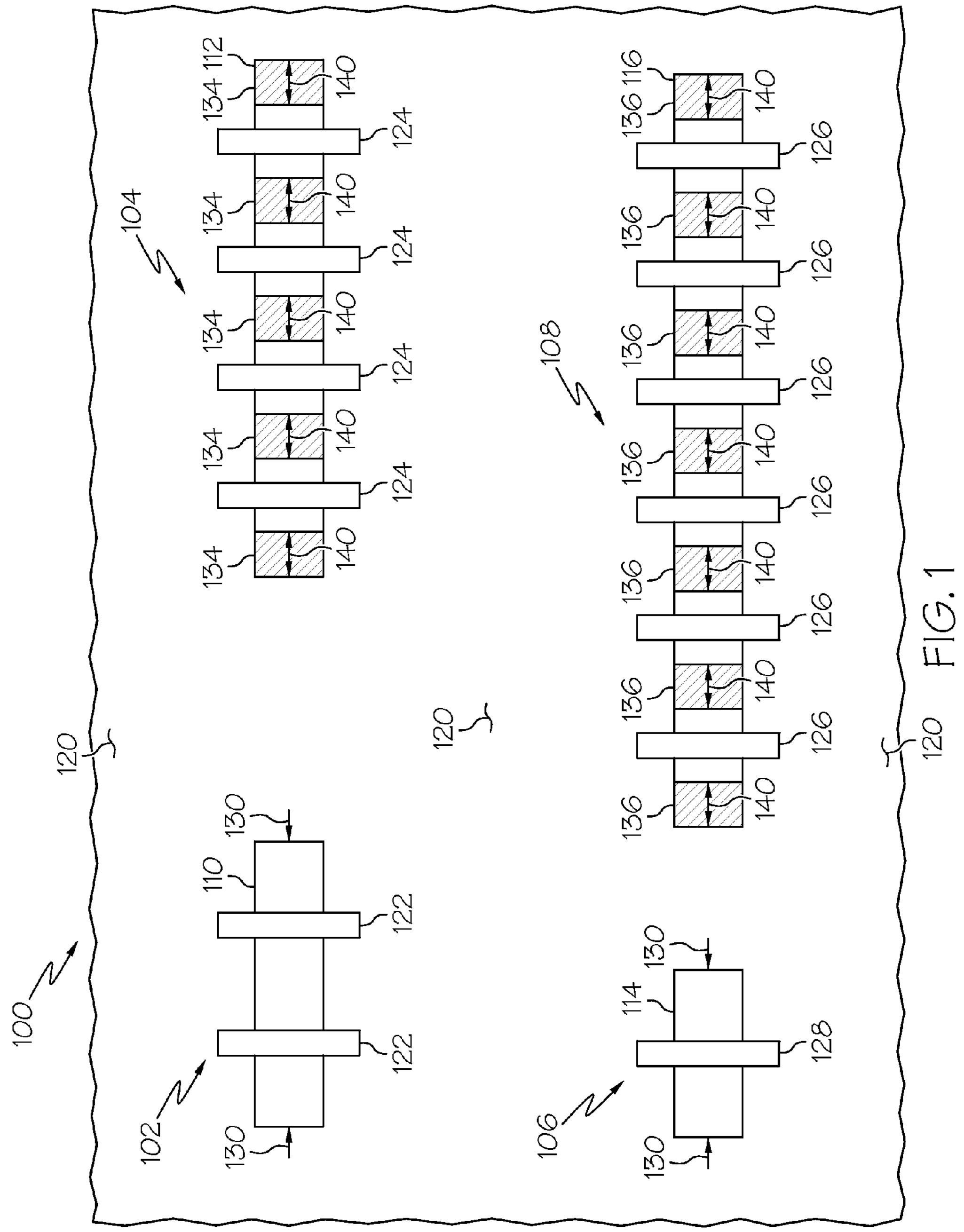
FIG. 1 is a schematic top view of an exemplary layout of device structures on a common substrate.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

In addition, certain terminology may be used in the following description for the purpose of reference only, and thus are not intended to be limiting. For example, terms such as "upper," "lower," "above," and "below" refer to directions in the drawings to which reference is made. Terms such as "front," "back," "rear," "side," "outboard," and "inboard" describe the orientation and/or location of portions of a feature or element within a consistent but arbitrary frame of reference which is made clear by reference to the text and the associated drawings describing the feature or element under discussion. Such terminology may include the words specifically mentioned above, derivatives thereof, and words of similar import. Similarly, the terms "first," "second," and other such numerical terms referring to structures do not imply a sequence or order unless clearly indicated by the context.

The techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over semiconductor material.

When fabricating MOS transistor devices for an integrated circuit chip or other product, it is common practice to form a plurality of gate structures (also referred to as gate lines, gate stacks, or gate fingers) overlying a continuous region or area of active semiconductor material. In practice, a common semiconductor substrate may include any number of active semiconductor regions, which are typically separated and insulated from one another using, for example, shallow trench isolation (STI). A single active semiconductor region could be used to form a single MOS transistor having only one gate finger, or a plurality of MOS transistors having a plurality of gate fingers. For example, a single active semiconductor region may have five, ten, or more than ten gate fingers formed thereon. FIG. 1 is a schematic top view of an exemplary layout of device structures on a common substrate 100. FIG. 1 depicts a small section of the common substrate 100; in reality, many more device structures could be fabricated concurrently on the common substrate 100.

FIG. 1 depicts four different PMOS transistor device structures 102, 104, 106, and 108, all formed on the same common substrate 100. Although not shown in FIG. 1, the common substrate 100 could also have a number of NMOS transistor device structures formed thereon. Each PMOS transistor device structure shown in FIG. 1 has a respective region, portion, or area of active semiconductor material associated therewith. More specifically, the PMOS transistor device structure 102 includes a defined region of active semiconductor material 110, the PMOS transistor device structure 104 includes a defined region of active semiconductor material 112, the PMOS transistor device structure 106 includes a defined region of active semiconductor material 114, and the PMOS transistor device structure 102 includes a defined region of active semiconductor material 116. In FIG. 1, these regions of active semiconductor material are represented by the horizontally oriented rectangular shapes that are crossed by the gate structures.

The semiconductor material used to create the PMOS transistor device structures 102, 104, 106, and 108 is preferably a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material can be either n-type or p-type, but is typically p-type, with wells of the appropriate type formed therein. Moreover, the semiconductor material may be part of a bulk semiconductor wafer, or it may be realized as a thin layer of semiconductor material on an insulating substrate (commonly known as semiconductor-on-insulator or SOI) that, in turn, is supported by a carrier wafer. In FIG. 1, the regions of active semiconductor material 110, 112, 114, and 116 are all insulated or otherwise electrically isolated from each other. In typical embodiments, STI can be used to insulate the regions of active semiconductor material 110, 112, 114, and 116 from one another. In FIG. 1, STI material 120 resides in those areas not occupied by the regions of active semiconductor material 110, 112, 114, and 116.

For the illustrated embodiment, the PMOS transistor device structure 102 includes two gate structures 122 formed overlying the region of active semiconductor material 110, while the PMOS transistor device structure 104 includes four gate structures 124 formed overlying the region of active semiconductor material 112. Similarly, the PMOS transistor device structure 108 includes six gate structures 126 formed overlying the region of active semiconductor material 116. In contrast, the PMOS transistor device structure 106 includes only one gate structure 128 formed overlying its region of active semiconductor material 114.

The performance of a PMOS transistor device can be improved by imparting compressive stress to the channel region underlying its gate structure. The compressive or "squeezing" stress on the channel region increases the mobility of holes in the channel region. If a relatively short region of active semiconductor material is used for a relatively low number of gate structures, then compressive stress imparted by the surrounding STI material may provide sufficient and acceptable benefits. The inward facing arrows in FIG. 1 represent the compressive stress 130 imparted by the STI material 120. Due to the relatively short longitudinal length of the regions of active semiconductor material 110 and 114, the compressive stress 130 can be efficiently and effectively transferred to the two channel regions of the PMOS transistor device structure 102, and to the channel region of the PMOS transistor device structure 106. Notably, the transfer of the compressive stress 130 in this manner reduces or obviates the need for compressive stressor regions in the PMOS transistor device structures 102 and 106.

In contrast, if a relatively long region of active semiconductor material is used for a relatively high number of gate structures, then the compressive stress imparted by STI material alone may be insufficient or somewhat ineffective because the compressive stress has little to no effect near the center of the region (although there may be some benefit realized at the outermost PMOS transistor devices). Accordingly, compressive stressor regions can be utilized to impart "localized" compressive stress to each channel region in a relatively long active semiconductor material section. In this regard, FIG. 1 depicts stressor regions 134 in the region of active semiconductor material 112 used for the PMOS transistor device structure 104, and stressor regions 136 in the region of active semiconductor material 116 used for the PMOS transistor device structure 108. The double headed arrows in FIG. 1 represent the compressive stress 140 imparted by the stressor regions 134 and 136.

As explained above, compressive stress imparted by the STI material 120 is the highest on the edges of the regions of active semiconductor material, and the amount of compressive stress is less in the interior of the regions of active semiconductor material. Thus, for PMOS transistor device structures having a low number of gate fingers (e.g., only one, two, or possibly three), the STI material 120 alone is more effective for device performance improvement (due to the proximity of the channel region(s) to the STI material 120). On the other hand, compressive stressor regions are more suitable for multi-finger devices (e.g., PMOS transistor device structures having more than two or three gate fingers). As explained in more detail below, the creation of compressive stressor regions involves the removal of semiconductor material, which in turn reduces or eliminates the compressive stress imparted by the STI material 120 (because little to no material remains upon which the STI material 120 can act). Moreover, PMOS transistor device structures with a low number of gate fingers do not get the full benefit of the compressive stressor regions, due to the relatively low volume of compressor stressor material formed with such device structures.

To address the above issues, a device fabrication process as described herein utilizes compressive stressor regions in a selective manner such that only those PMOS transistor device structures having a relatively high number of gate fingers receive the compressive stressor regions, while the remaining PMOS transistor device structures are formed without any compressive stressor regions. As a result, some PMOS transistor device structures can take full advantage of the benefits of compressive stressor regions, while other PMOS transistor device structures on the same common substrate can take full advantage of the benefits of compressive stress imparted by STI material.

Figure 2:
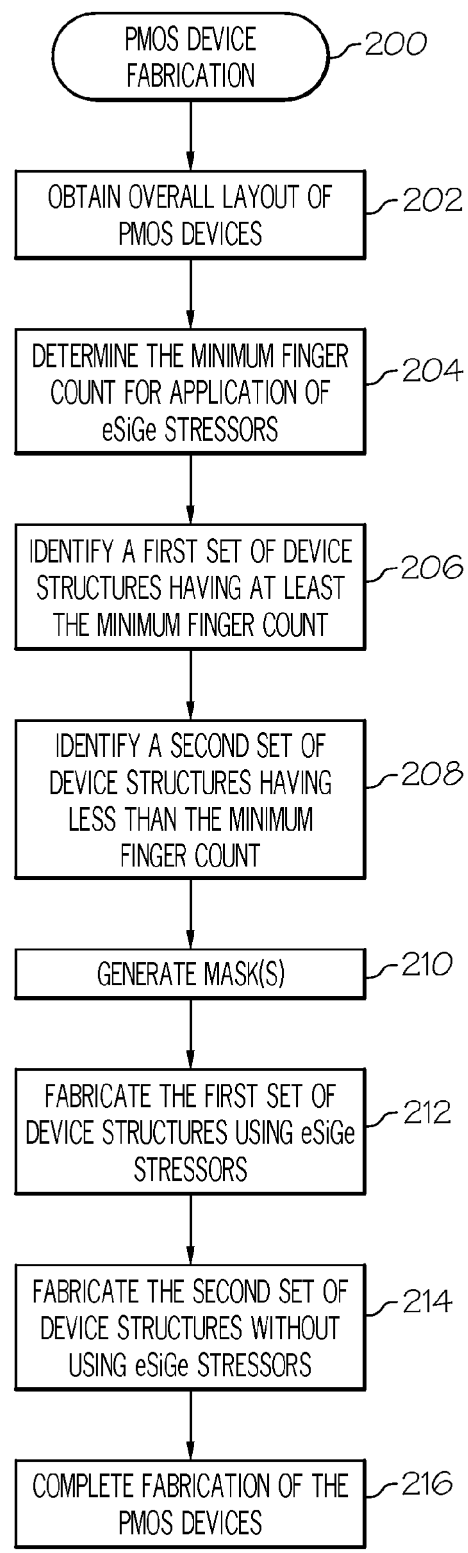
FIG. 2 is a flow chart that illustrates an exemplary embodiment of a PMOS device fabrication process.

FIG. 2 is a flow chart that illustrates an exemplary embodiment of a PMOS device fabrication process 200, which can be used to fabricate PMOS transistor device structures on a common substrate. Some of the tasks performed in connection with process 200 may be performed by software, hardware, firmware, or any combination thereof. It should be appreciated that process 200 may include any number of additional or alternative tasks, the tasks shown in FIG. 2 need not be performed in the illustrated order, and process 200 may be incorporated into a more comprehensive procedure or process having additional functionality not described in detail herein. Moreover, an embodiment of process 200 might omit one or more of the illustrated tasks, as long as the intended features and device characteristics are still fabricated.

Process 200 may begin by obtaining a layout of PMOS transistor devices (task 202) that represents an intended pattern of device structures to be fabricated. Although not described in detail here, the layout may also include features for a number of NMOS transistor devices to be created on the same wafer. In practice, task 202 could be performed with and/or executed using computer-aided design tools that are known in the semiconductor industry. In certain embodiments, this layout is an overall layout corresponding to a wafer (or a section thereof) to be subjected to a manufacturing process. In this regard, FIG. 1 depicts one exemplary layout of PMOS transistor devices. The layout designates a plurality of device structures, each having a respective and corresponding region of active semiconductor material, and each having at least one gate finger (i.e., gate structure, gate stack, or gate line) associated therewith. Process 200 may also determine a minimum gate count for application of stressor regions on the common substrate (task 204). The minimum gate count is an integer greater than one, and it represents a threshold number of gate fingers/structures for a PMOS transistor device structure. For example, if the determined gate count is three (N=3), then any PMOS transistor device structure having three or more gate structures overlying its region of active semiconductor material will receive compressive stressor regions, and any PMOS transistor device structure having less than three gate structures overlying its region of active semiconductor material will not receive compressive stressor regions. The determination made during task 204 may be influenced by any number of factors and parameters. For instance, the minimum gate count (N) might be influenced by one or more of the following, without limitation: the process node technology to be used to fabricate the devices (e.g., 32 nm technology, 22 nm technology, etc.); the particular fabrication process steps to be used to fabricate the devices (e.g., the STI process conditions); the design and/or functionality of the circuit in which the devices will be used; the materials used to fabricate the devices; certain layout characteristics of the features and elements to be fabricated (e.g., the dimensions of the active region and the surrounding STI region, or the pitch of the gate structures); certain properties and characteristics of the particular materials used to create the devices; and the like. Accordingly, the minimum gate count may be two for some embodiments, three for other embodiments, and possibly higher for yet other embodiments.

After the minimum gate count has been determined, process 200 can identify a first set of device structures from the designated plurality of device structures (task 206). Each device structure in this first set has a number of gate fingers that is greater than or equal to the minimum gate count. For consistency with FIG. 1, this example assumes that the minimum gate count is three. Thus, any device structure having at least three gate structures will be designated as a member of the first set. Accordingly, the PMOS transistor device structures 104 and 108 will be members of this first set. Process 200 also identifies a second set of device structures from the designated plurality of device structures (task 208). Each device structure in this second set has a number of gate fingers that is less than the minimum gate count. For this example, any device structure having less than three gate structures will be designated as a member of the second set. Accordingly, the PMOS transistor device structures 102 and 106 will be members of this second set. In practice, once the first set (or the second set) has been identified, the remaining device structures by default will be members of the second set (or the first set). In other words, the creation of the two sets need not be associated with two distinct tasks as depicted in FIG. 2.

After the device structures in the layout have been identified, labeled, or otherwise separated as described above, process 200 may generate any number of manufacturing process masks that enable fabrication of the first set of device structures and the second set of device structures in the desired manner (task 210). Task 210 may be associated with the generation of data corresponding to the layout of one or more photolithographic mask patterns and/or the creation of the actual photolithographic masks themselves. These photolithographic masks can be used during various fabrication process steps including, without limitation: ion implantation; etching; silicidation; material deposition; and the like. Notably, these masks will be suitably arranged and designed to accommodate the fabrication of compressive stressor regions for the PMOS transistor device structures in the first set, and to accommodate the fabrication of the PMOS transistor device structures in the second set without any compressive stressor regions. Moreover, the masks could be arranged and designed to accommodate a CMOS process, such that NMOS transistor device structures are protected during some process steps that apply to the PMOS transistor devices structures.

Eventually, process 200 continues by fabricating the first set of device structures on the common substrate (task 212) and by fabricating the second set of device structures on the same common substrate (task 214). Task 212 involves the fabrication of compressive stressor regions, and task 214 does not involve the fabrication of compressive stressor regions. Exemplary embodiments typically use embedded silicon germanium (denoted here by eSiGe) to create the compressive stressor regions. After the compressive stressor regions have been created, process 200 continues by completing the fabrication of the PMOS transistor devices (task 216). Task 216 may employ any number of well known and conventional process steps, which will not be described in detail here.

Figure 3:
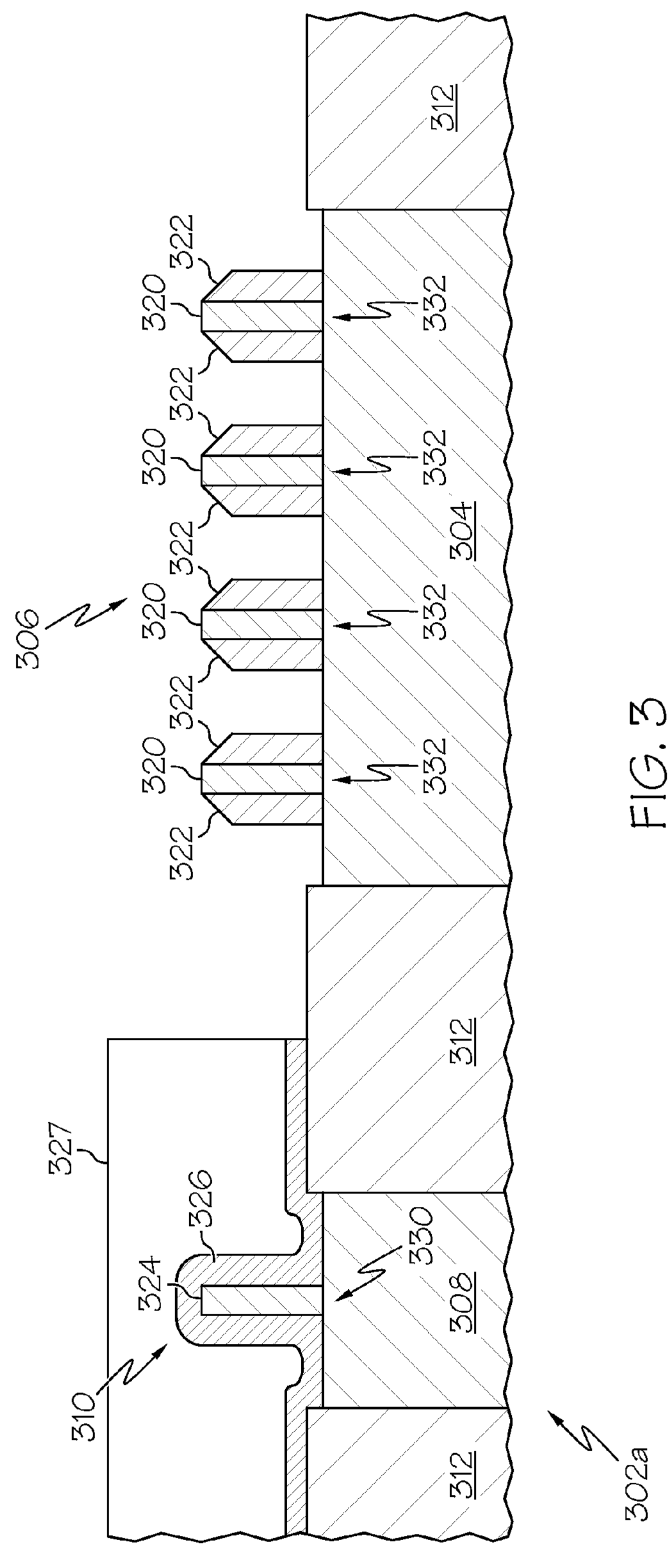
FIGS. 3-7 are cross sectional views that illustrate exemplary PMOS transistor device structures on a common substrate, and a method of fabricating the PMOS transistor device structures.
Figure 4:
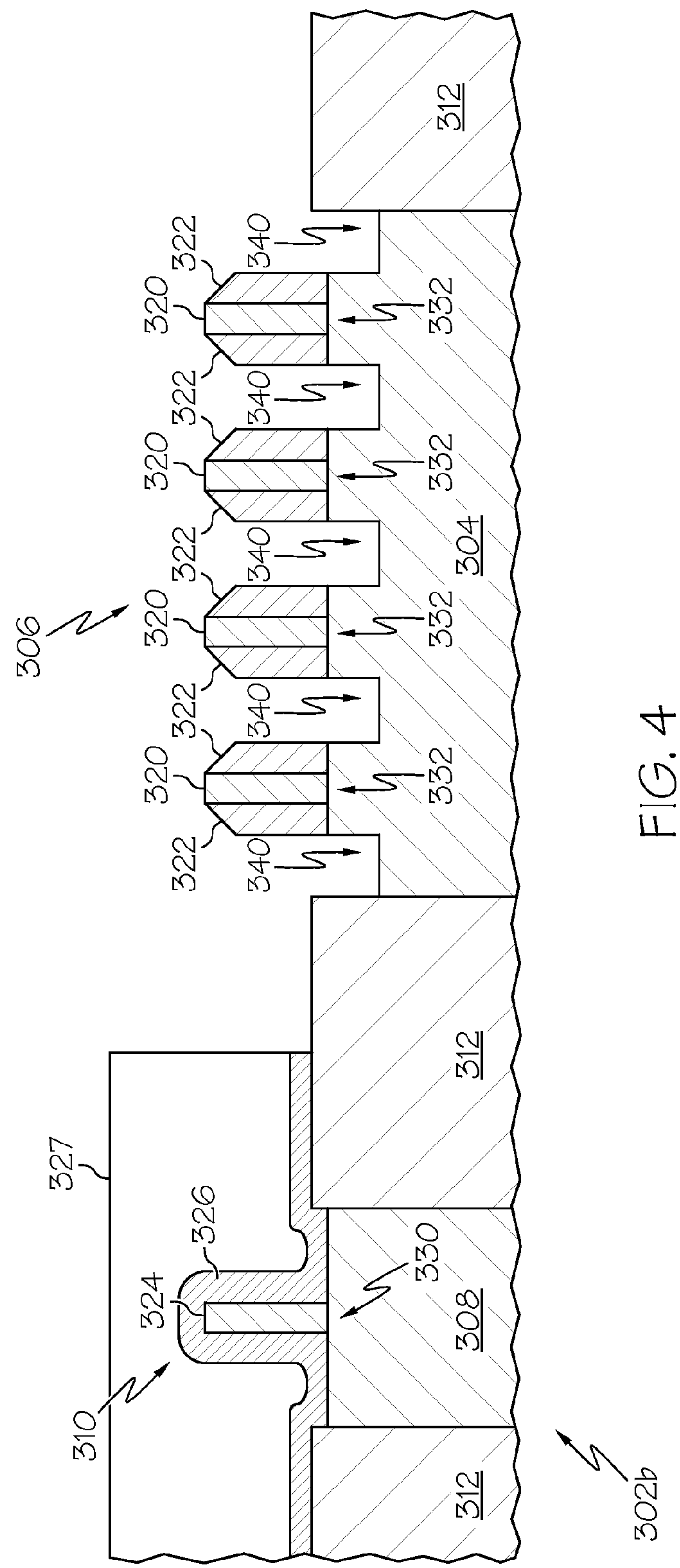

FIGS. 3-7 are cross sectional views that illustrate exemplary PMOS transistor device structures on a common substrate 302, and a method of fabricating the PMOS transistor device structures. FIG. 3 depicts the common substrate 302*a* at an intermediate stage of the overall manufacturing process. In particular, FIG. 3 depicts a first portion of semiconductor material 304 that is used for a first PMOS transistor device structure 306, a second portion of semiconductor material 308 that is used for a second PMOS transistor device structure 310, and insulating regions 312 that separate the first portion of semiconductor material 304 from the second portion of semiconductor material 308. As mentioned previously, the semiconductor material 304 and 308 may be realized using a bulk substrate or an SOI substrate. FIG. 3 depicts the state of the common substrate 302*a* after the insulating regions 312 have been formed to create insulating/isolating regions around the first portion of semiconductor material 304 and around the second portion of semiconductor material 308. Referring also to the exemplary layout depicted in FIG. 1, the insulating regions 312 define and separate regions of active semiconductor material, which is used for the PMOS transistor device structures 306 and 310. In certain embodiments, the insulating regions 312 are formed from a material that imparts compressive stress against the outer boundaries of the first and second portions of semiconductor material 304 and 308. In practice, this material may be, without limitation: an oxide material; or any other material having the desired physical and mechanical properties sufficient to impart compressive stress. The insulating regions 312 are typically formed as STI regions, as is well understood.

FIG. 3 depicts the state of the common substrate 302*a* after formation of gate structures and sacrificial material (including disposable spacers) overlying the active semiconductor material. For this exemplary embodiment, FIG. 3 shows four gate structures 320 formed overlying the first portion of semiconductor material 304, and corresponding disposable spacers 322 adjacent the sidewalls of the gate structures 320. FIG. 3 also shows one gate structure 324 formed overlying the second portion of semiconductor material 308, and material 326 overlying the gate structure 324. Each of the gate structures 320 and 324 is formed overlying a respective channel region. In this regard, the gate structure 324 overlies a channel region 330 that resides in the second portion of semiconductor material 308. Similarly, each of the gate structures 320 overlies a respective channel region 332 that is located in the first portion of semiconductor material 304. The gate structures 320 and 324 can be fabricated concurrently using well known process steps, and each of the gate structures 320 and 324 may be realized using a stacked arrangement of materials (e.g., a lower gate insulator layer, a metal gate layer, a polycrystalline silicon gate element, and an upper nitride cap layer).

After formation of the gate structures 320 and 324, the disposable spacers 322 can be formed using well known process steps, such as conformal deposition of a nitride (or oxide) material and etching. The disposable spacers 322 are typically formed from a nitride material, although other compositions could be used. For this example, the disposable spacers 322 and the material 326 are formed from a common material (such as nitride), which may be conformally deposited on the wafer using conventional material deposition techniques. FIG. 3 depicts the state of the common substrate 302*a* after the disposable spacers 322 have been formed by etching. As is well understood by those familiar with semiconductor fabrication techniques, patterned photoresist material 327 can be used to protect the gate structure 324 during the etching step that forms the disposable spacers 322. Consequently, the material 326 remains overlying the gate structure 324 after the etching step creates the disposable spacers 322. In certain embodiments, the patterned photoresist material 327 also covers and protects NMOS transistor device structures or regions on the common substrate 302.

Although other fabrication steps or sub-processes may be performed after the formation of the gate structures and spacers, this example continues by creating recesses exclusively in the first portion of semiconductor material 304, and without creating any counterpart recesses in the second portion of semiconductor material 308. In accordance with the illustrated embodiment, the first portion of semiconductor material 304 is selectively and anisotropically etched to form recesses 340 therein. The anisotropic etch may be performed using, for example, a $CF_4$ based chemistry. Thus, the first portion of semiconductor material 304 is directionally etched, using the gate structures 320 and the disposable spacers 322 as a self-aligned etch mask, to create the recesses 340 (alternatively, in certain situations it may be possible to etch the recesses 340 concurrently with the formation of the disposable spacers 322). This etching step is controlled to form recesses 340 having the desired overall depth. After etching, at least a portion of each channel region 332 resides between two adjacent recesses 340 (see FIG. 4). In other words, each channel region 332 is flanked by two outboard recesses 340.

The second PMOS transistor device structure 310 is protected while the recesses 340 are being etched, to prevent counterpart recesses from being formed in the second portion of semiconductor material 308. In certain embodiments, the second PMOS transistor device structure 310 could be covered by an appropriate material, such as the patterned photoresist material 327. Notably, the patterned photoresist material 327 protects the second PMOS transistor device structure 310, any other device structures that have less than the minimum number of gate fingers, and (in certain situations) NMOS device structures on the common substrate 302. Accordingly, the particular photoresist material 327 used for this purpose can be selected such that it can withstand the etching chemistry and etching technique used to form the recesses 340.

Figure 5:
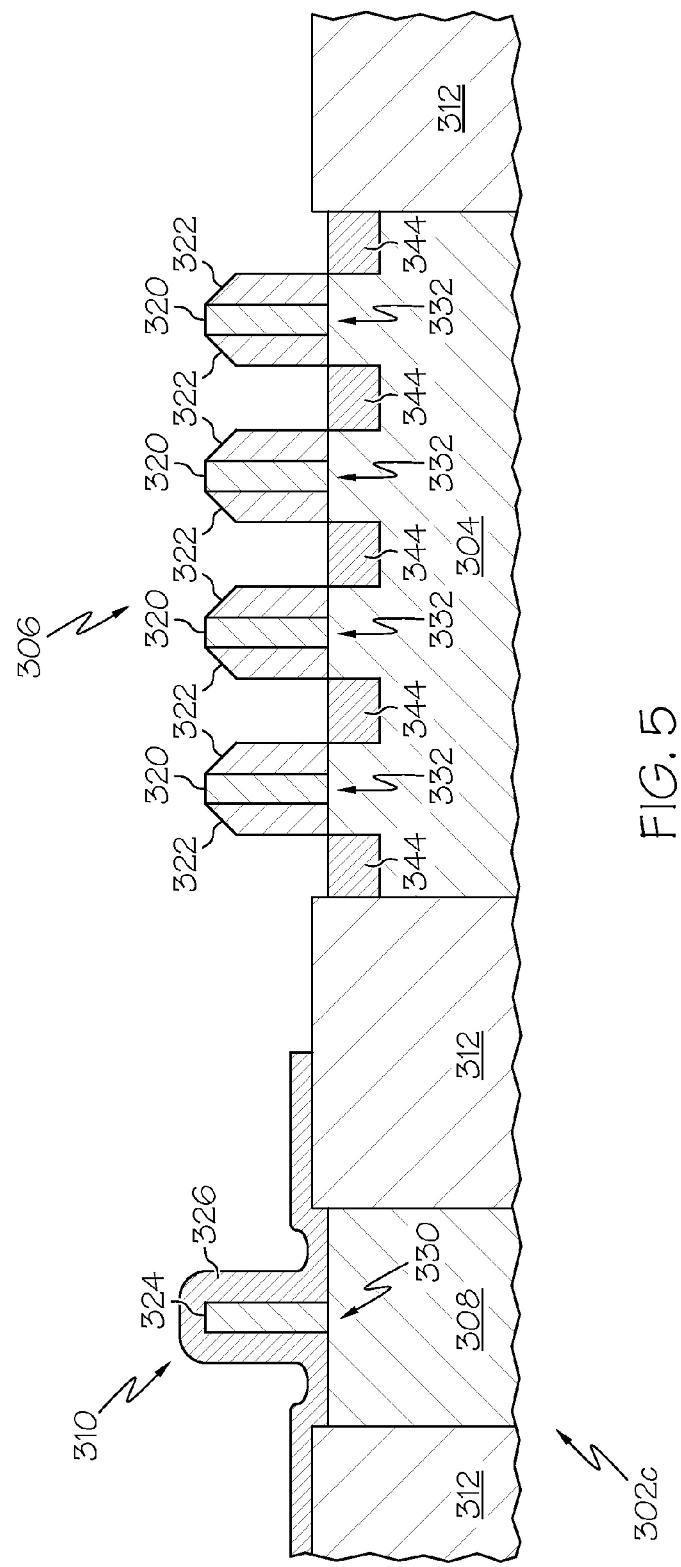

Although other fabrication steps or sub-processes may be performed after the formation of the recesses 340, this example continues by removing the patterned photoresist material 327 and, thereafter, at least partially filling the recesses 340 with a stress-inducing semiconductor material, which may (but need not be) an in-situ doped silicon based material. FIG. 5 shows the state of the common substrate 302*c* after removal of the photoresist material 327 and after the recesses 340 have been filled with stress-inducing semiconductor material 344. In this embodiment, the stress-inducing semiconductor material 344 is formed by selectively epitaxially growing a silicon material in the recesses 340.

For a PMOS transistor device, the stress-inducing semiconductor material 344 is a p-type semiconductor material, such as a silicon germanium material, or any other material that has a greater lattice constant than silicon, such as a compound semiconductor, or the like. When epitaxially growing the stress-inducing semiconductor material 344 in the recesses 340, the second PMOS transistor device structure 310 remains protected by the material 326 to prevent unwanted growth of the epitaxial material on the second portion of semiconductor material 308. For this embodiment, the stress-inducing semiconductor material 344 represents compressive stressor regions for the first PMOS transistor device structure 306. As explained previously, these compressive stressor regions impart compressive stress to the channel regions 332. Notably, the second PMOS transistor device structure 310 remains free of any channel stressor regions, as shown in FIG. 5.

Figure 6:
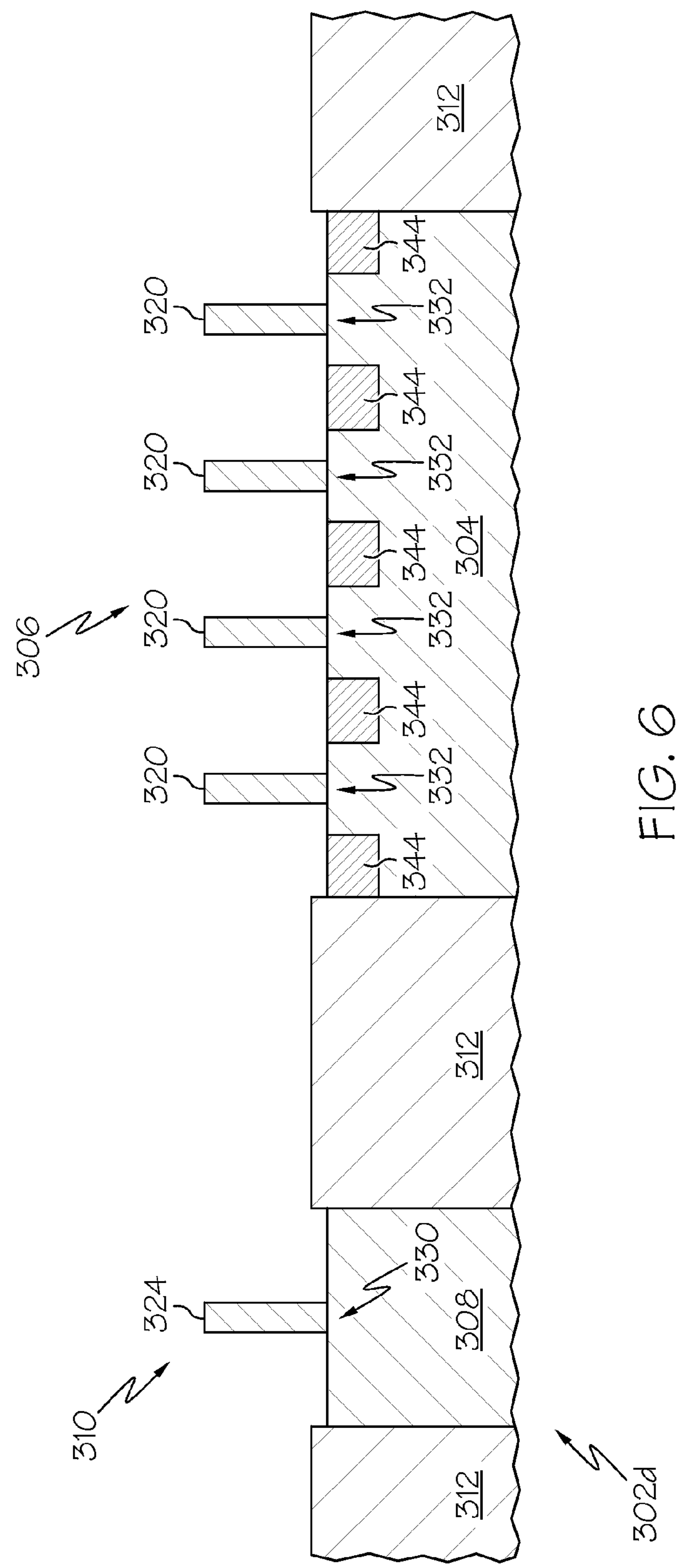

Although other fabrication steps of sub-processes may be performed at this time, this example continues by removing the disposable spacers 322 and the material 326 from the common substrate 302. FIG. 6 depicts the state of the common substrate 302*d* after removal of this sacrificial material. The disposable spacers 322 and the material 326 may be removed concurrently using the same etching chemistry and technique, since the composition of the disposable spacers 322 is the same as the material 326. In practice, this etching step is selective to the particular material used to form the disposable spacers 322 and the material 326.

Figure 7:
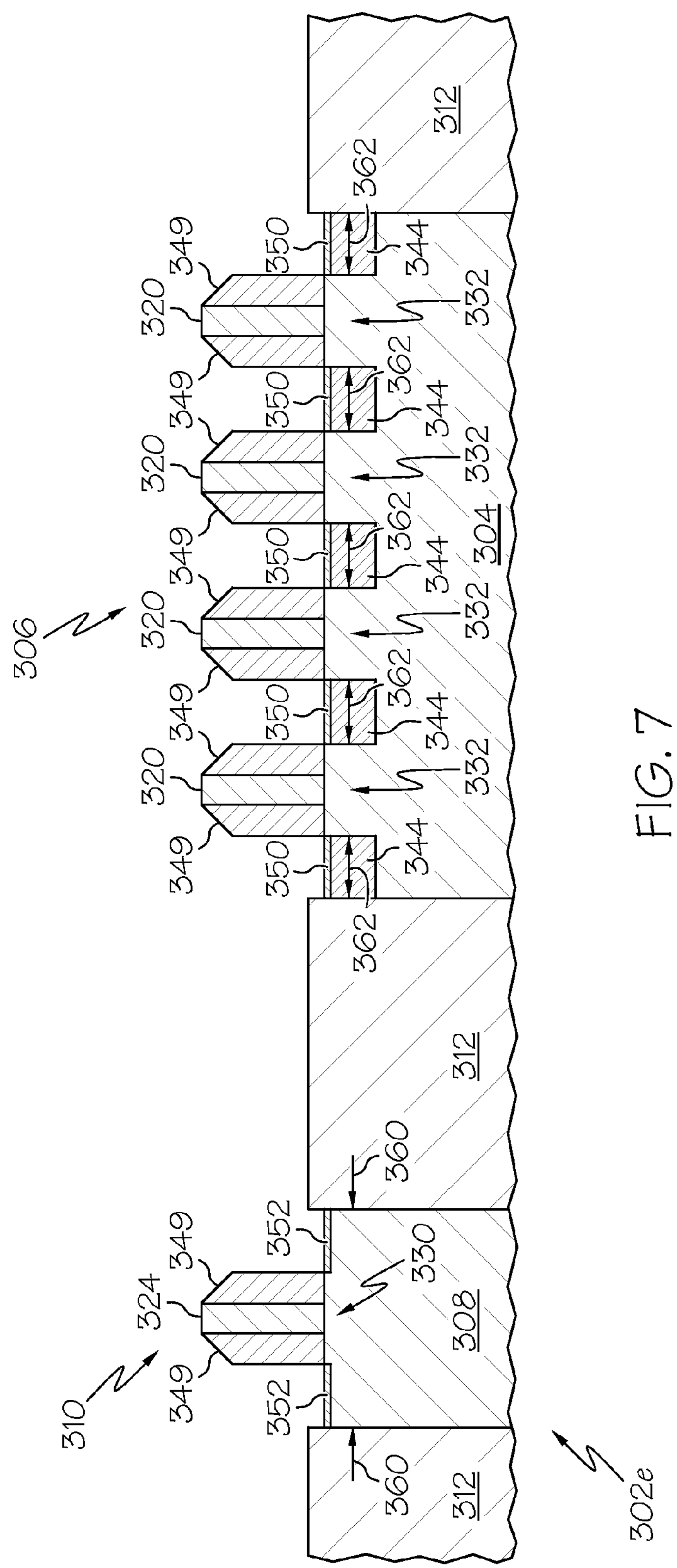

Although other fabrication steps or sub-processes may be performed at this time (e.g., thermal annealing), this example continues by forming final spacers 349 and metal silicide contact areas 350 on the stress inducing semiconductor material 344. FIG. 7 depicts the state of the common substrate 302*e* after fabrication of the final spacers 349 and after formation of the silicide contact areas 350. The final spacers 349 may be formed using well-known process steps, including material deposition, photolithography, etching, and the like. The final spacers 349 may be implemented in a one-step (single sidewall spacers) or a two-step (inner and outer sidewall spacers) manner, depending upon the particular application. In typical processes, each of the final spacers 349 might include an inner oxide spacer and an outer nitride spacer (for simplicity, FIG. 7 depicts each of the final spacers 349 as a single element). As is well understood, the final spacers 349 can be used to mask certain regions of the common substrate 302*e* during ion implantation steps, which are typically performed to create extension implants, deep source/drain implants, halo implants, or the like. Moreover, it should be appreciated that the final spacers 349 need not be aligned with stress-inducing semiconductor material 344 as depicted in FIG. 7. For example, the final spacers 349 could be formed such that they overlap the stress-inducing semiconductor material 344, or such that some space remains between the final spacers 349 and the stress-inducing semiconductor material 344.

In certain embodiments, metal silicide contact areas 352 can be formed on the second portion of semiconductor material 308. In practice, the metal silicide contact areas 352 can be concurrently formed with the metal silicide contact areas 350 (on the first portion of semiconductor material 304). In addition, metal silicide contact areas (not shown) may be formed on polycrystalline silicon gate material used for the gate structures 320 and 324. It should be apparent that FIG. 7 depicts the common substrate 302*e* after a number of known process steps have been performed. For the sake of brevity, these intermediate steps will not be described in detail. In practice, an appropriate silicidation process is performed to create the metal silicide contact areas 350 and 352. For example, a layer of silicide-forming metal (not shown) is deposited onto the surface of the stress-inducing semiconductor material 344 and onto the surface of the second portion of semiconductor material 308. The silicide-forming metal can be deposited, for example, by sputtering to a thickness of about 5-50 nm and preferably to a thickness of about 10 nm. The common substrate 302*e* is then heated, for example by rapid thermal annealing, to form the silicide contact areas 350 and 352. The silicide-forming metal can be, for example, cobalt, nickel, rhenium, ruthenium, or palladium, or alloys thereof. Any silicide-forming metal that is not in contact with exposed silicon does not react during heating and, therefore, does not form a silicide. This excess metal may be removed by wet etching or any suitable procedure.

Thereafter, any number of known process steps can be performed to complete the fabrication of the PMOS transistor devices (and, if applicable, any NMOS transistor devices on the common substrate 302). For the sake of brevity, these process steps and the resulting PMOS transistor devices are not shown or described here. Thus, PMOS transistor devices can be manufactured in the manner described here such that some of them (e.g., those with a relatively high number of gate fingers) utilize compressive stressor regions, while others (e.g., those with a relatively low number of gate fingers) do not include compressive stressor regions. In this regard, FIG. 7 illustrates how the STI material imparts inward compressive stress 360 on the channel region 330 of the second PMOS transistor device structure 310, while the stress-inducing semiconductor material 344 imparts localized compressive stress 362 on the channel regions 332 of the first PMOS transistor device structure 308.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating p-type metal oxide semiconductor (PMOS) transistor devices on a common substrate, the method comprising:

obtaining a layout of PMOS transistor devices, the layout designating a plurality of PMOS device structures, and each of the plurality of PMOS device structures having a respective region of active semiconductor material and at least one gate finger associated therewith;

obtaining a minimum gate count for application of stressor regions;

identifying, from the plurality of PMOS device structures, a first set of PMOS device structures, where each PMOS device structure in the first set of PMOS device structures has a plurality of gate fingers that is greater than or equal to the minimum gate count;

identifying, from the plurality of PMOS device structures, a second set of PMOS device structures, where each PMOS device structure in the second set of PMOS device structures has a number of gate fingers that is less than the minimum gate count;

fabricating the first set of PMOS device structures on the common substrate using compressive stressor regions, and such that the gate fingers for the first set of PMOS device structures are formed overlying a first continuous region of active semiconductor material; and fabricating the second set of PMOS device structures on the common substrate without using compressive stressor regions, and such that the gate fingers for the second set of PMOS device structures are formed overlying a second continuous region of active semiconductor material, wherein the first continuous region of active semiconductor material and the second continuous region of active semiconductor material are separated and insulated from each other.

2. The method of claim 1, further comprising generating manufacturing process masks that enable fabrication of the first set of device structures and the second set of device structures.

3. The method of claim 1, further comprising forming, on the common substrate, isolation regions that define and separate regions of the active semiconductor material for the plurality of device structures.

4. The method of claim 3, wherein the isolation regions are formed from a material that imparts compressive stress to channel regions of the plurality of device structures.

5. The method of claim 1, wherein fabricating the first set of device structures comprises creating recesses in the first continuous region of active semiconductor material of the first set of device structures such that respective channel regions underlying the gate fingers of the first set of device structures reside between two adjacent recesses, without creating any counterpart recesses in the second continuous region of active semiconductor material of the second set of device structures.

6. The method of claim 5, further comprising forming compressive stress-inducing semiconductor material in the recesses, the compressive stressor regions comprising the compressive stress-inducing semiconductor material.

7. The method of claim 6, wherein forming the compressive stress-inducing semiconductor material comprises epitaxially growing a silicon germanium material in the recesses.

* * * * *